United States Patent
Lee et al.

(10) Patent No.: US 6,258,696 B1
(45) Date of Patent: Jul. 10, 2001

(54) SYSTEM AND METHOD FOR FABRICATING SEMICONDUCTOR DEVICE AND ISOLATION STRUCTURE THEREOF

(75) Inventors: Myoung Goo Lee; Tak Hyun Yoon, both of Cheongju (KR)

(73) Assignee: Hyundai Electronics Industries Co., LTD, Kyoungki-Do (KR)

( * ) Notice: Subject to any disclaimer, the term of this patent is extended or adjusted under 35 U.S.C. 154(b) by 0 days.

(21) Appl. No.: 09/396,449

(22) Filed: Sep. 15, 1999

(30) Foreign Application Priority Data

Nov. 4, 1998 (KR) .................................................. 98-47105

(51) Int. Cl.[7] .................................................. H01L 21/762
(52) U.S. Cl. ............................................. 438/424; 257/510
(58) Field of Search ............................ 438/424, 425, 438/427, 439, 447, 449, 218, 221, 225; 257/509, 510

(56) References Cited

U.S. PATENT DOCUMENTS

| | | | | |
|---|---|---|---|---|
| 5,753,961 | * | 5/1998 | Tsuchiaki ............................... | 257/510 |
| 5,837,612 | * | 11/1998 | Ajuria et al. .......................... | 438/424 |
| 5,976,927 | * | 11/1999 | Hsieh et al. .......................... | 438/257 |
| 6,060,357 | * | 5/2000 | Lee ....................................... | 438/257 |
| 6,066,543 | * | 5/2000 | Takahashi et al. .................... | 438/424 |
| 6,103,020 | * | 8/2000 | Roberts et al. ....................... | 257/509 |

* cited by examiner

*Primary Examiner*—Olik Chaudhuri
*Assistant Examiner*—Anh Duy Mai

(57) ABSTRACT

A method for fabricating a semiconductor device and an isolation structure thereof is disclosed. The isolation structure of a semiconductor device includes a first isolation step for forming a line-shaped active region on a semiconductor substrate wherein the line-shaped active region is consecutive in a lengthy direction, and a second isolation step for electrically isolating the line-shaped active regions in a lengthy direction by a predetermined length for thereby overcoming the problems such as a rounded corner portion problem, a pattern length decrease, etc. and enhancing the integrity of the semiconductor device.

15 Claims, 11 Drawing Sheets

| PATTERN TYPE | DEPTH OF FOCUS MARGIN |
|---|---|
| 61 | 0.7 |
| 62 | 0.4~0.5 |
| 63 | 0.3 |

(PATTERN PITCH : 0.44 μm)

SYSTEM AND METHOD FOR FABRICATING SEMICONDUCTOR DEVICE AND ISOLATION STRUCTURE THEREOF

BACKGROUND OF THE INVENTION

1. Field of the Invention

The present invention relates to a system and method for fabricating a semiconductor device and an isolation structure thereof, and in particular to an improved system and method for fabricating a semiconductor device and an isolation structure thereof which are capable of overcoming problems such as a rounded corner portion problem, a pattern length decrease, etc. and enhancing the integrity of the semiconductor device.

2. Description of the Background Art

Generally, when fabricating a semiconductor device, a semiconductor substrate is divided into an active region in which a semiconductor device is formed and a non-active region that is electrically isolated from the active region. Through this division, a MOSFET (Metal Oxide Semiconductor Field Effect Transistor) may be fabricated.

Figure 1:
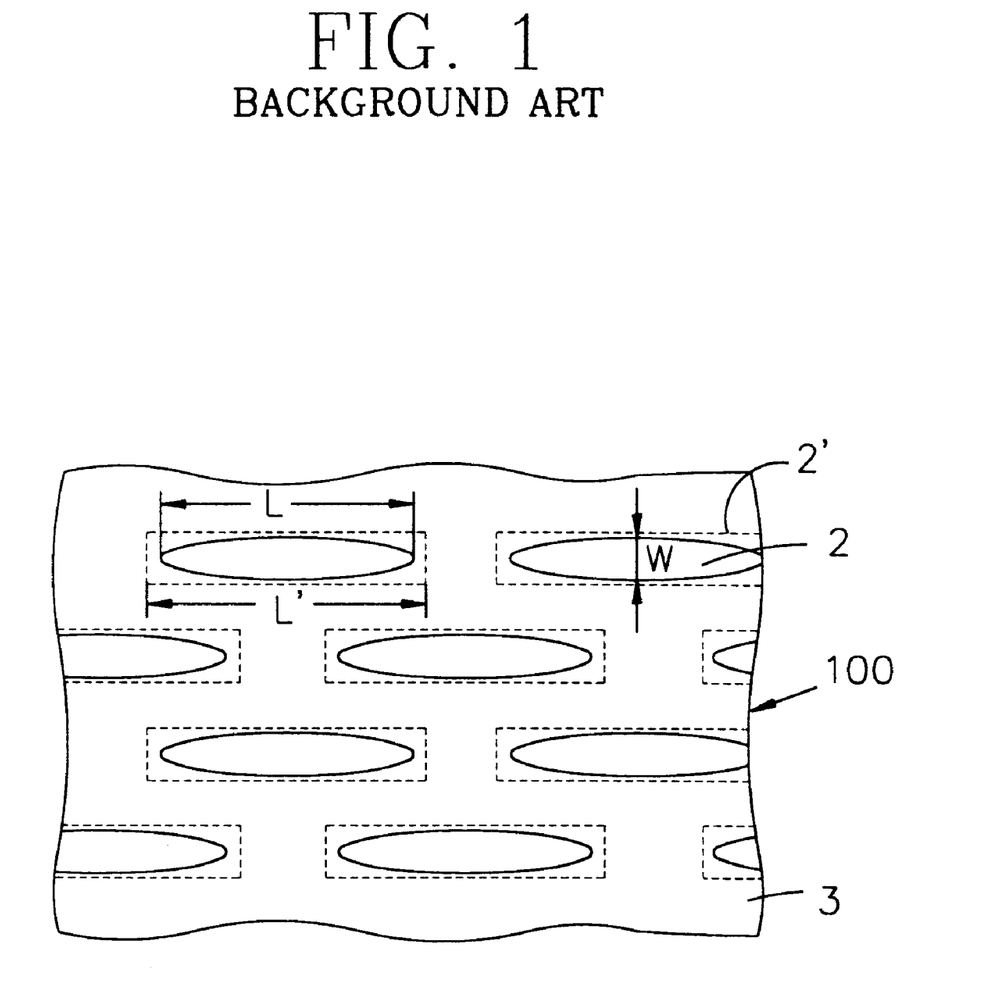
FIG. 1 is a plan view illustrating a semiconductor substrate for showing an isolation structure of a background semiconductor device.

FIG. 1 illustrates a semiconductor substrate having an active region 2 and a non-active region 3 for fabricating a conventional DRAM (Dynamic Random Access Memory) cell among the semiconductor devices. In the drawings, reference numeral 2 represents the active region 2 on the semiconductor substrate 100 which is shown by a full line, and a reference numeral 2' represents a pattern of an ideal (desired) active region which is shown by a dotted line. The region around the active region 2 is a non-active region 3.

FIGS. 2A through 2D illustrate a process for fabricating the active region 2 and the non-active region 3 of FIG. 1, namely, the isolation structure fabrication process for a semiconductor device.

Figure 2A:
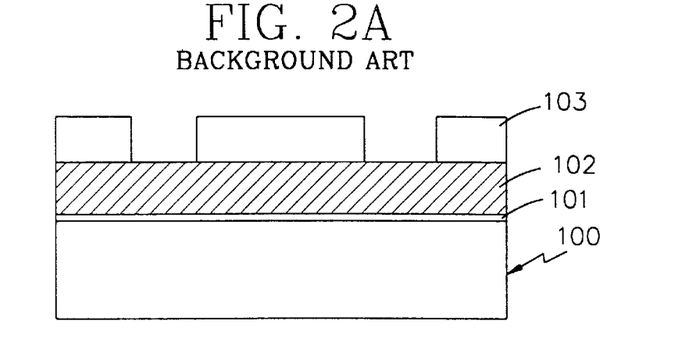
FIGS. 2A through 2D are cross-sectional views illustrating an isolation structure fabrication process for a background semiconductor device.

As shown therein, a first insulation film 101 and a second insulation film 102 are formed on the semiconductor substrate 100. Generally, the first insulation film 101 is formed of an oxide film, and the second insulation film 102 is formed of a nitride film. A photoresist pattern 103 corresponding to the active region is formed on the second insulation film 102. At this time, the photoresist pattern 103 is formed of an island shape pattern like the active region pattern 2' of FIG. 1.

Figure 2B:
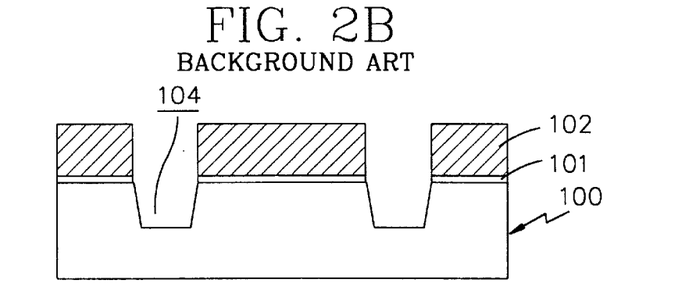

As shown in FIG. 2B, the second insulation film 102 and the first insulation film 101 are etched using the photoresist pattern 103 as a mask. Thereafter, the semiconductor substrate 100 formed on the portion in which the first insulation film 101 is removed by etching to a predetermined thickness, thereby forming a shallow trench 104.

Figure 2C:
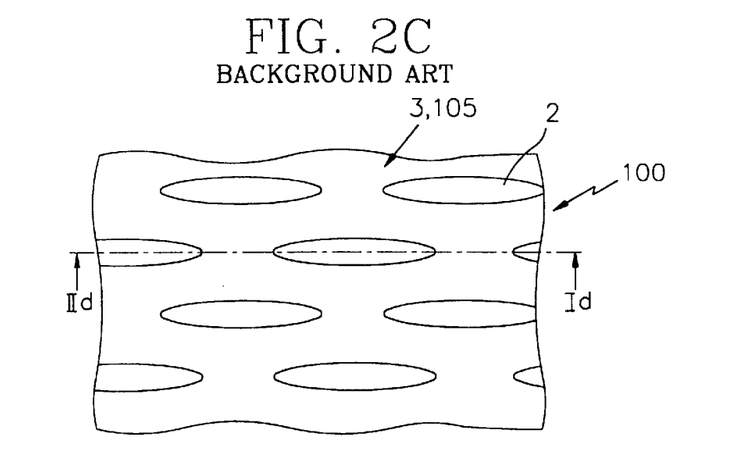
Figure 2D:
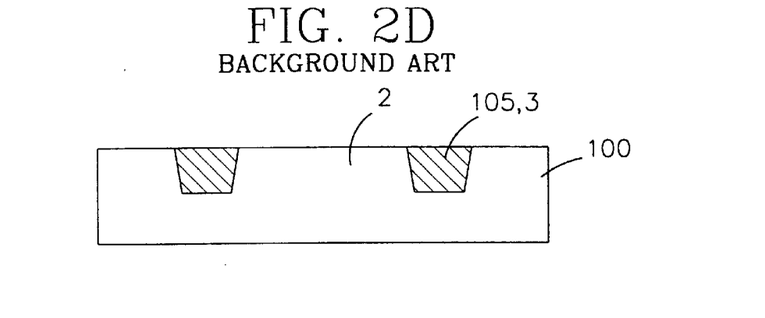

As shown in FIG. 2C, a third insulation film (oxide film) 105 is filled into the shallow trench 104. The upper surface of the semiconductor substrate 100 is planerized by a planerizing process. FIG. 2D is a cross-sectional view taken along the line IId—IId of FIG. 2C. In the drawings, reference numeral 3 represents a device isolation region(non-active region) filled by the third insulation film 105, and reference numeral 2 represents an active region. As shown in FIG. 2C, the active region 2 is not a rectangular shape region but a corner-rounded rectangular shape region. Namely, the corner portions of the photoresist pattern 103 are rounded when forming the photoresist pattern 103 during a light exposing process. Therefore, since the semiconductor substrate 100 is etched using the photoresist pattern 103 as a mask, the corner portions of the active region 2 are rounded.

In the above-described process, instead of the process in which the shallow trench 104 is formed, the LOCOS (Local Oxidation of silicon) may be processed for etching the nitride and oxide films using the photoresist pattern 13 as a mask, oxidizing the exposed semiconductor substrate and forming a thick oxide film (field oxide film).

Figure 3A:
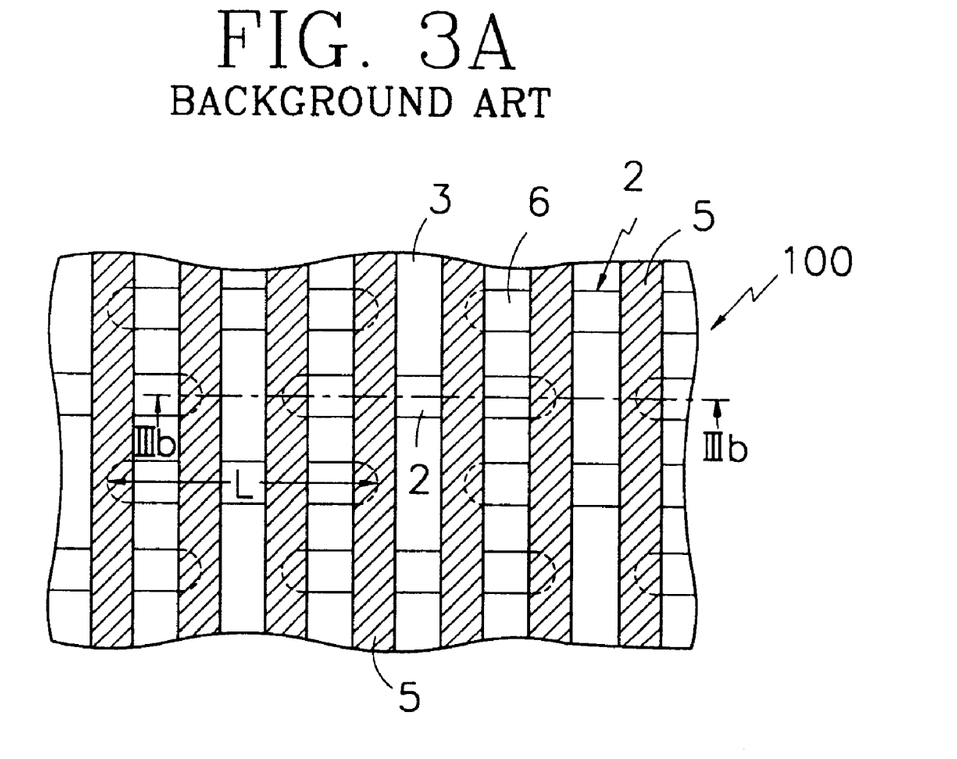
FIG. 3A is a plan view illustrating a semiconductor device fabricated using a background semiconductor device isolation structure.

FIG. 3A illustrates a semiconductor substrate after the MOSFET is formed on the semiconductor substrate 100 of FIG. 2D, after the above-described device isolation process is completed. Namely, the gate insulation film and the conductive layer are formed on the semiconductor substrate 100 of FIG. 2D and subsequently are patterned to form a gate electrode 5 as a word line, which extends in a direction perpendicular to a direction along the length L of the active region 2. A dopant is implanted into the active region 2 of the gate electrode 5 to form the source 6 and the drain 6 for thus fabricating the MOSFET which is the semiconductor device.

Figure 3B:
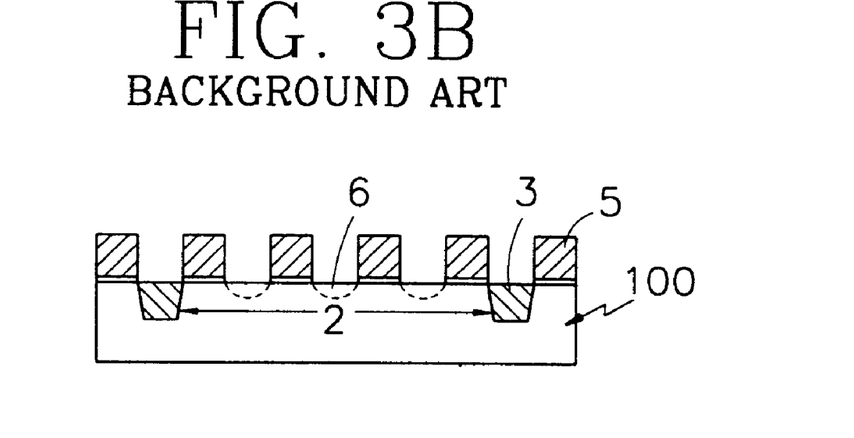
FIG. 3B is a vertical cross-sectional view taken along the line IIIb—IIIb of FIG. 3A.

FIG. 3B is a vertical cross-sectional view taken along the line IIIb—IIIb of FIG. 3A. The reference numerals of FIG. 3B correspond to the reference numerals of the elements of FIG. 3A.

The problems of the fabrication method for a known semiconductor device isolation structure fabrication method will be explained with reference to FIGS. 1 and 2A through 2D.

As shown in FIG. 1, a plurality of active regions 2 are formed like islands on the semiconductor substrate 1, and selectively isolated by the non-active region 3. In FIG. 1, the rectangular region 2' indicated by the dotted line is an ideal active region pattern 1. However, the active region 2 formed on the semiconductor substrate using the rectangular active region pattern 2' is rounded in its corner portions. Namely, the corner portions of the active region 2 formed on the semiconductor substrate are rounded based on the photolithography and etching processes that are performed based on a rectangular active region pattern. In addition, the length L of the active region 2 becomes smaller than the length L' of the ideal active region pattern 2' due to the lens distortion problem, optical adjacent effect, etc. Therefore, when forming a wire connection contact hole at the end portions at both sides of the active region, the fabrication margin may be decreased, and when the position alignment accuracy is decreased when forming the contact hole, a connection error may occur between the wiring portion and the active region, thereby decreasing a reliability of the semiconductor device and production yield.

When the distance between adjacent active region patterns 2 is short in the direction of the width W of the active region pattern 2 of FIG. 1, the adjacent active region patterns 2 may be unintentionally combined into one active pattern, causing a short circuit in the semiconductor device formed using the active region pattern 2'. To overcome the above-described problems, a substantial distance has been formed between the active region pattern 2 and the active region pattern 2', causing a decrease in the number of devices integrated on the semiconductor substrate, thereby decreasing the integration characteristic of the semiconductor devices.

SUMMARY OF THE INVENTION

It is an object of the present invention to provide a method for fabricating a semiconductor device and an isolation structure thereof which overcome the aforementioned and other problems encountered in the background art.

It is another object of the present invention to provide a method for fabricating a semiconductor device and an isolation structure thereof which are capable of overcoming the problems such as a rounded corner portion problem, a pattern length decrease, etc. and enhancing the integrity of the semiconductor device.

It is another object of the present invention to provide a method for fabricating a semiconductor device and an isolation structure thereof which are implemented in the light exposing process when the resolution is high based on the line-and-space shape pattern with the island shape pattern is easier than the island shape pattern. A first isolation process is performed for forming the line-shaped active region based on the line-and-space shape pattern formation process, and then a second isolation process is performed with respect to the line-shaped active region, thereby forming an active region similar to the ideal active pattern.

To achieve the above objects, there is provided a method for fabricating a semiconductor device which includes forming a line-shaped first mask pattern on a semiconductor substrate, said line-shaped first mask pattern being consecutive in a lengthy direction, forming a trench by etching the semiconductor substrate using the first mask pattern, forming a line-shaped active region by removing the first mask pattern, forming a first non-active region by filling an insulation film into the trench, forming a gate insulation film on the semiconductor substrate, forming a gate electrode pattern in a direction perpendicular to the line-shaped active region by forming a conductive layer on the gate insulation film and patterning the same, implanting a dopant into the semiconductor substrate at both sides of the gate electrode pattern, forming a second mask pattern having an opening portion at a predetermined portion of the line-shaped active region on the entire structure of the semiconductor substrate, forming a groove by etching the semiconductor substrate through the opening portion, and forming a second non-active region by filling the insulation film into the groove.

To achieve the above objects, there is provided an isolation structure of a semiconductor device which includes a first isolation step for forming a line-shaped active region on a semiconductor substrate, said line-shaped active region being consecutive in a lengthy direction, and a second isolation step for electrically isolating the line-shaped active regions in a lengthy direction by a predetermined length.

Additional advantages, objects and features of the invention will become more apparent from the description which follows.

BRIEF DESCRIPTION OF THE DRAWINGS

The present invention will become more fully understood from the detailed description given hereinbelow and the accompanying drawings which are given by way of illustration only, and thus should not limit the scope of the present invention, and wherein.

DETAILED DESCRIPTION OF THE PREFERRED EMBODIMENTS

The system and method of fabricating a semiconductor device isolation structure according to the present invention will be explained with reference to FIGS. 4A through 4G.

Figure 4A:
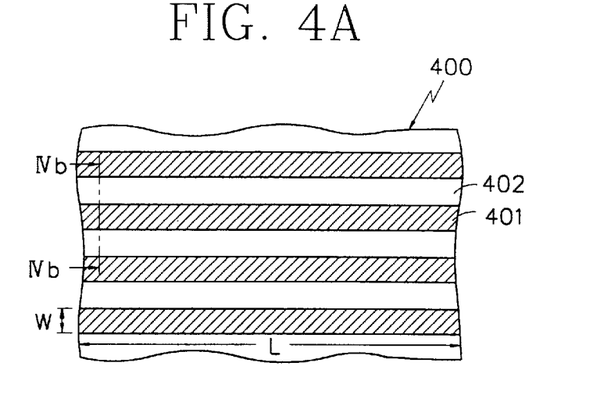
FIGS. 4A through 4G are cross-sectional views illustrating an isolation structure fabrication process for a semiconductor device according to the present invention.

As shown in FIG. 4A, a first insulation film 401 is formed on a semiconductor substrate 400, and a mask layer is formed on the first insulation film 401, so that a plurality of line-shaped first mask patterns 402 are sequentially formed in the direction of the length L by patterning the mask layer. The first mask pattern 402 is referred to as a line, and the exposed surface of the first insulation film 401 in which the mask layer is removed is referred to as a space. The formation process of the first mask pattern 402 is called as a line-and-space pattern formation process. As a material of the mask pattern 402, a photoresist is generally used because it is well adaptable to the fabrication process.

Figure 4B:
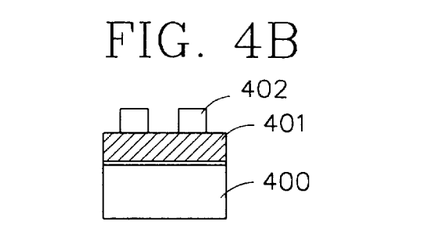

FIG. 4B is a cross-sectional view taken along the line IVb—IVb of FIG. 4A. The reference numerals of FIG. 4B correspond to the reference numerals of the elements of FIG. 4A.

Figure 4C:
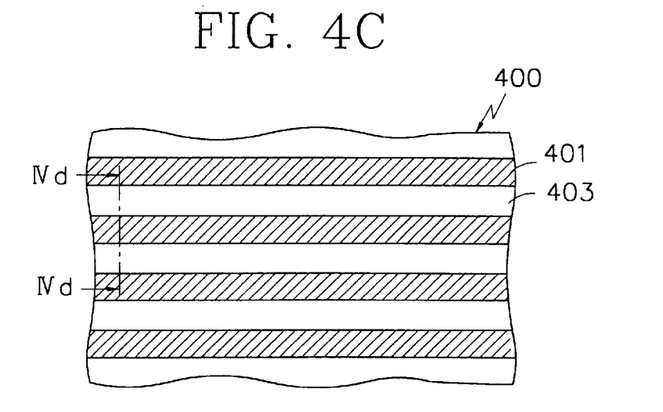

Next, the first insulation film 401 is etched using the first mask pattern 402 as a mask. Continuously, the semiconductor substrate 400 formed on the etched insulation film is etched to a predetermined depth, thereby forming the trench 403 as shown in FIG. 4C. Thereafter, the first mask pattern 402 is removed. The portion of the semiconductor substrate which is not etched by a protection of the first mask pattern 402 is called as a line-shaped active region 402'.

Figure 4D:
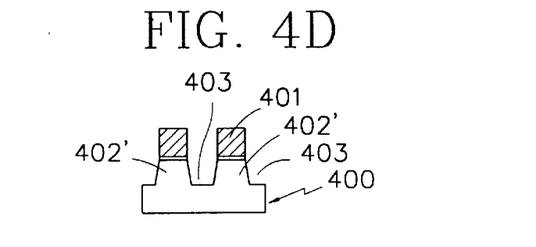

FIG. 4D is a cross-sectional view taken along the line IVd—IVd of FIG. 4C. The reference numerals of FIG. 4D correspond to the reference numerals of the elements of FIG. 4D.

The second insulation film 403' is formed on the semiconductor substrate of FIG. 4C and then planerized based on a CMP (Chemical Mechanical Polishing) process or an etch-back process, so that the upper surface of the semiconductor substrate 400 of the line-shaped active region 402' is exposed. The upper surface of the semiconductor substrate 400 is exposed, and the upper surface of the second insulation film 403' filled in the trench 403 and the upper surface of the line-shaped active region 402' of the semiconductor substrate 400 are planerized.

The trench 403, as shown in FIG. 4C, is filled by a material of the second insulation film 403', thereby forming a first non-active region 403'. The above-described process is called a first isolation process for purposes of this disclosure.

Figure 4E:
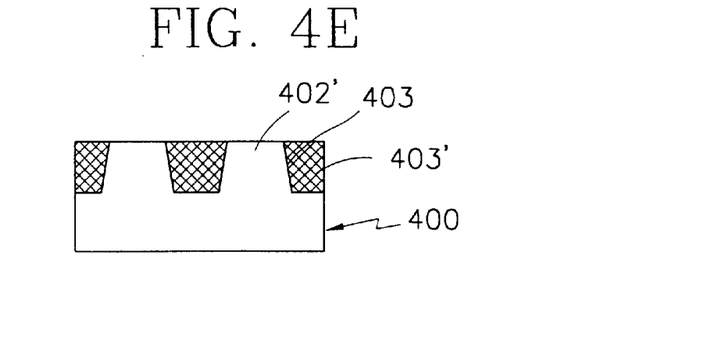
Figure 4F:
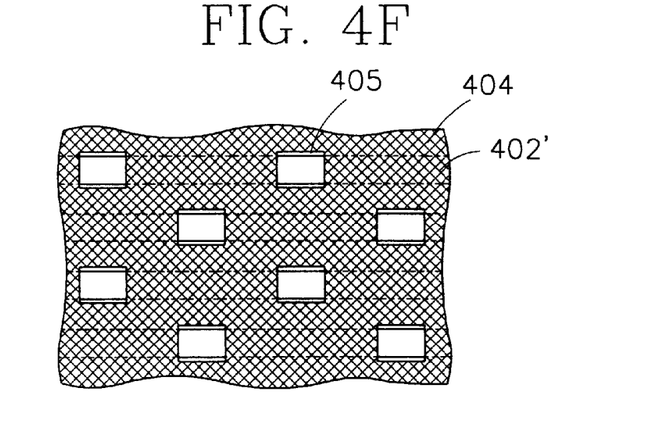

Next, as shown in FIG. 4F, a second mask pattern 404 is formed on the entire structure of the semiconductor substrate 400. The mask pattern 404 is preferably formed of a photoresist. The second mask pattern 404 has an opening portion 405 formed on only the upper surface of the line-shaped active region 402'. The semiconductor substrate 400 of the line-shaped active region 402' is etched to a predetermined depth through the opening portion 405, thereby forming a groove (not identified by reference) in the semiconductor substrate at the position of holes 405. The above-described groove acts to isolate the line-shaped active region 402' in a direction parallel to the length by a predetermined length.

Figure 4G:
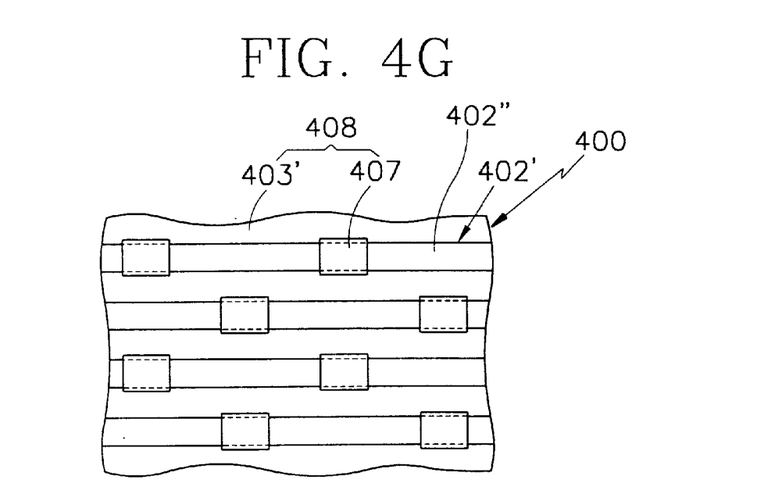

Next, the second mask pattern 404 is removed, and a third insulation film is formed on the entire structure of the semiconductor substrate 400 having the above-described groove 403' (first non-active region). A planerizing process, such as an etch back process or a chemical and mechanical polishing process, is then performed to complete the isolation structure fabrication process of a semiconductor device according to a first embodiment of the present invention, as shown in FIG. 4G.

In the above-described planerizing process, the groove 403' (fast non-active region) is filled by the third insulation film 407. The portion filled by the third insulation film 407 is called as a second non-active region 407. In addition, the process after the first device isolation process is called as a second isolation process. As shown in FIG. 4E, a valid active region 402" includes the regions other than the portion filled by the third insulation film 407 (second non-active region) in the line-shaped active region 402. In addition, a valid non-active region 408 is a combined region of the first non-active region 403 and the second non-active region 407.

The present invention is directed to fabricating an isolation structure of a semiconductor device by forming a line-shaped active region and a non-active region by the first isolation process without forming the conventional island-shaped active region, and isolating the line-shaped active region in a direction of its length by the second isolation process.

Therefore, in the present invention, it is possible to overcome the problem that the fabrication margin is decreased due to the rounded corner portions of the active region, and the decrease of the active region.

Figure 5A:
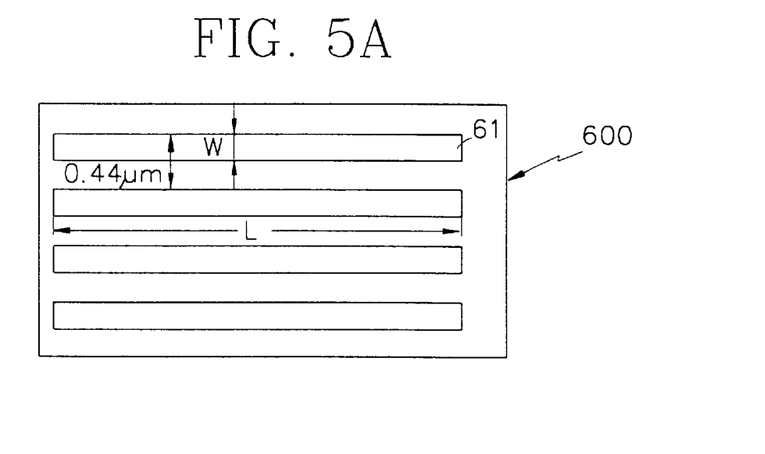
FIG. 5A is a plan view illustrating a semiconductor substrate having a gate electrode pattern.

FIG. 5A illustrates a pattern 61 of the gate electrode used in a DRAM using the process of the present invention. The gate electrode pattern 61 is formed of a line-shaped pattern, and the distance between the gate electrode patterns 61 in the width W direction of the gate electrode pattern is 0.44 mm.

Figure 5B:
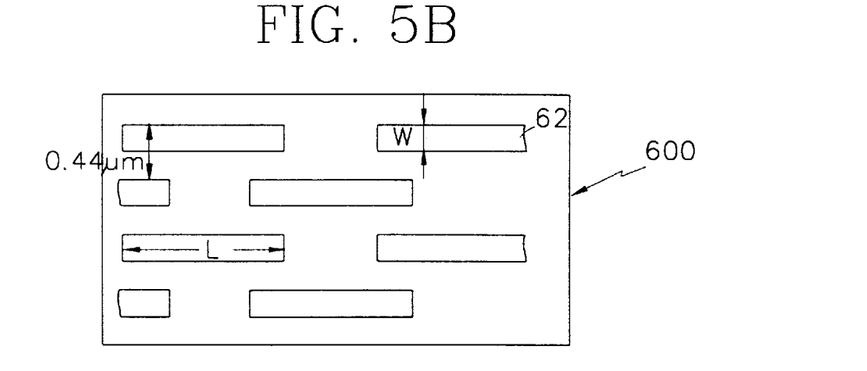
FIG. 5B is a plan view illustrating a semiconductor substrate having an active region with an island shape pattern.

FIG. 5B illustrates an active region pattern 62 used in the DRAM semiconductor device using the process of the present invention. The distance between the patterns 62 in the width W direction of the active region pattern 62 is 0.44 mm. However, in this case, the pattern has an island shape that is different from the line-shaped gate electrode pattern 61 of FIG. 5A.

Figure 5C:
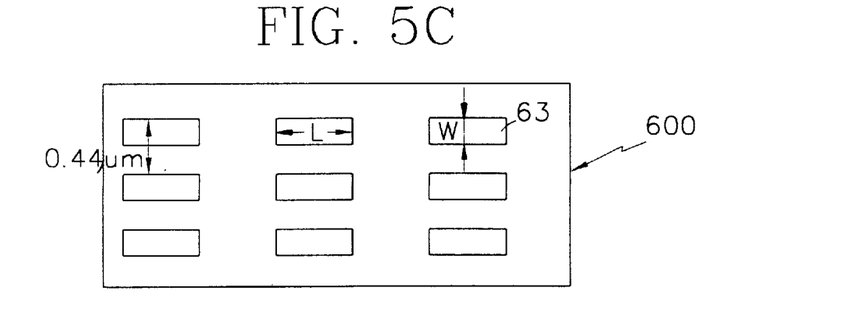
FIG. 5C is a plan view illustrating a semiconductor substrate having a predetermined island shape pattern.

FIG. 5C illustrates a predetermined island shape pattern 63. The distance in the width W direction of the pattern 63 is 0.44 mm. In this pattern 63, the length L is shorter than the active pattern 62 shown in FIG. 5B.

Figure 6:
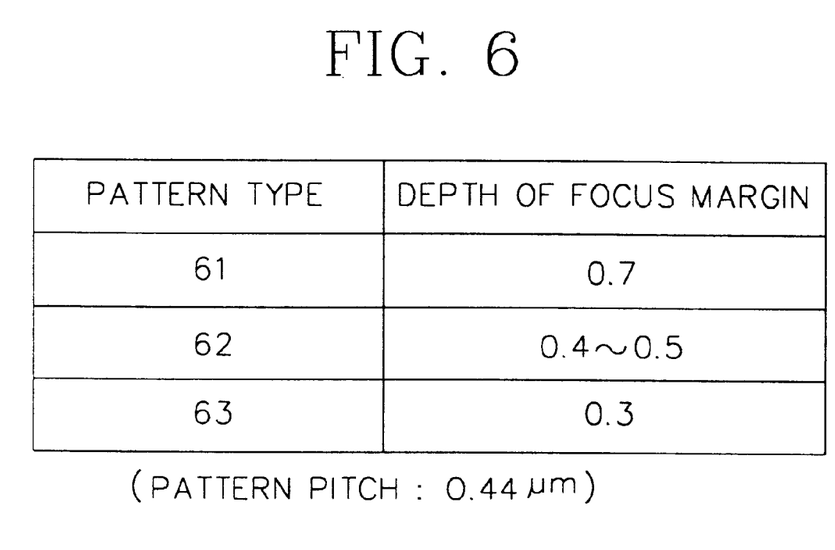
FIG. 6 illustrates experimental data concerning the depth of focus when forming the patterns of FIGS. 5A–5C.

FIG. 6 illustrates a result of an experiment which represents the depth of focus when forming the pattern of FIGS. 5A through 5C.

As shown therein, even when the distances in the width W direction of the patterns are identical, the line-shaped pattern of FIG. 5A has a predetermined depth of focus that is higher than the island-shaped pattern of FIG. 5C. Namely, the depth of the focus is larger and the resolution is increased, enabling implementation of a fine pattern. Therefore, even if the distance between the patterns is narrowed, namely, the density of the patterns is increased, it is possible to implement a desired pattern. Since the distance in the W direction of the pattern may be decreased, it is possible to fabricate more semiconductor devices in any particular area, thereby enabling an increase in the integrity of the devices. In addition, since it is possible to form an accurate pattern, the fabrication margin is enhanced. Therefore, the reliability of the semiconductor device fabricated in accordance with the above-described processes is enhanced.

In the present invention, the isolation structure for a semiconductor device is fabricated by forming the active pattern in the length-wise direction based on the line-and-space shape pattern formation process without forming the active pattern in an island shape. Therefore, in the present invention, a consecutive active region and non-active region is formed, resulting in implementation of a substantial amount of the ideal active region.

FIGS. 7A through 7l illustrate the semiconductor device fabrication method based on a semiconductor device isolation structure fabrication method according to the present invention.

Figure 7A:
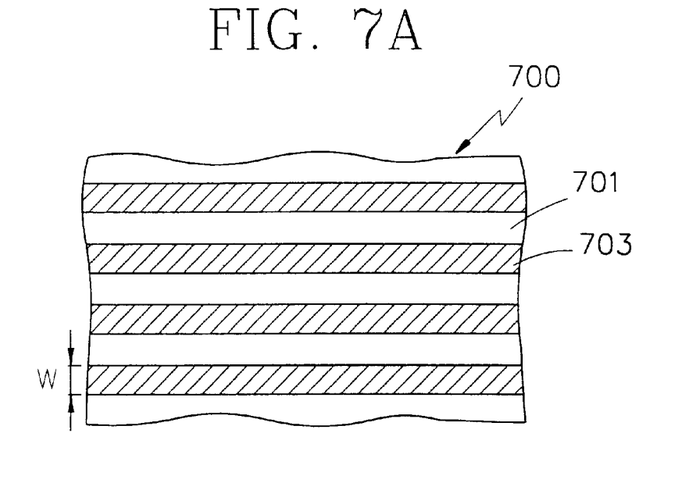
FIGS. 7A through 7L are cross-sectional views illustrating a semiconductor device fabrication process using an isolation structure fabrication method for a semiconductor device according to the present invention.

As shown in FIG. 7A, a first insulation film 701 is formed on the semiconductor substrate 700, and a line-shaped first mask pattern 703 is formed on the first insulation film 701. The first mask pattern 703 is formed of a photoresist.

Figure 7B:
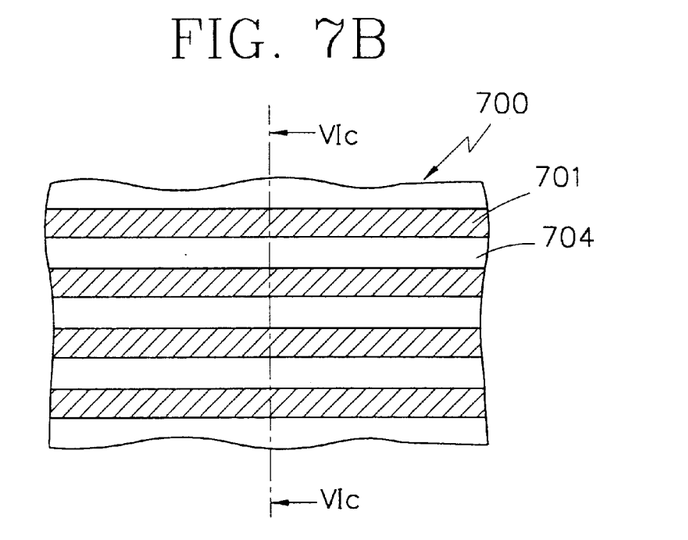

Next, the first insulation film 701 is etched and removed using the first mask pattern 703 as a mask, and then the semiconductor substrate 700 below the portion in which the first insulation film 701 is etched to a predetermined depth and removed for thereby forming a trench 704, as shown in FIG. 7B.

Figure 7C:
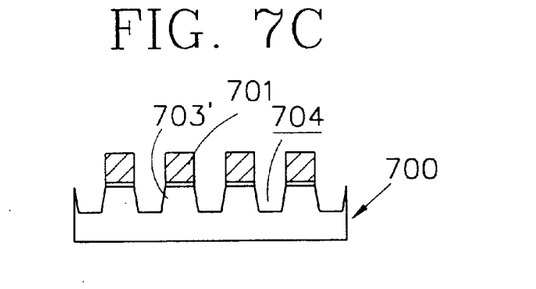

FIG. 7C is a cross-sectional view taken along the line VIc—VIc of FIG. 6B.

Figure 7D:
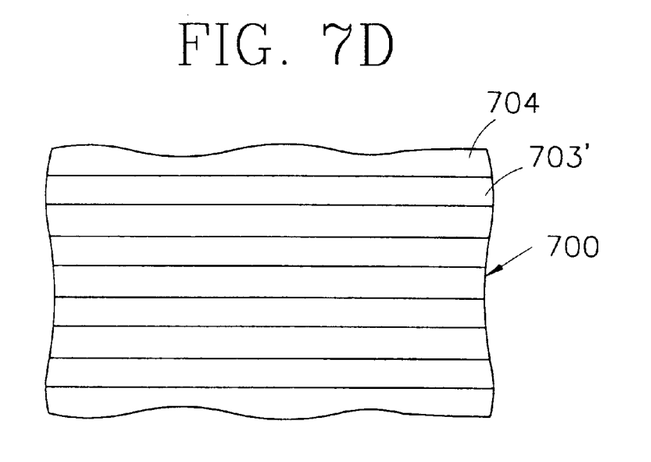

As shown in FIG. 7D, the first mask pattern 703 is removed. The semiconductor substrate 700 is divided into a non-etched region, namely, a line-shaped active region 703' and an etched region, namely, a trench 704.

Figure 7E:
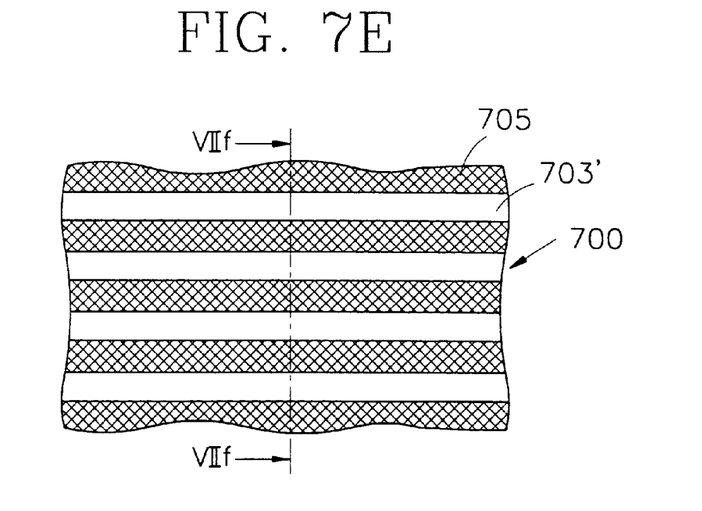

A second insulation film (not shown) is formed on the entire surface of the semiconductor substrate 700 and then is planerized based on the chemical and mechanical polishing method or the etch-back method, thereby exposing the surface of the line-shaped active region 703'. Thereafter, as shown in FIG. 7E, the trench 704 is filled by the second insulation film 705. The portion filled by the second insulation film 705 is a first non-active region 705.

Figure 7F:
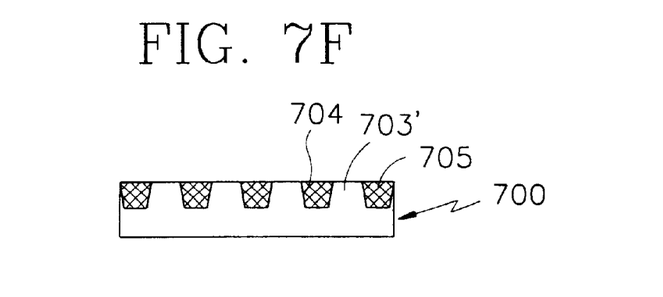

FIG. 7F is a cross-sectional view taken along the line VIf—VIf of FIG. 7E.

Figure 7G:
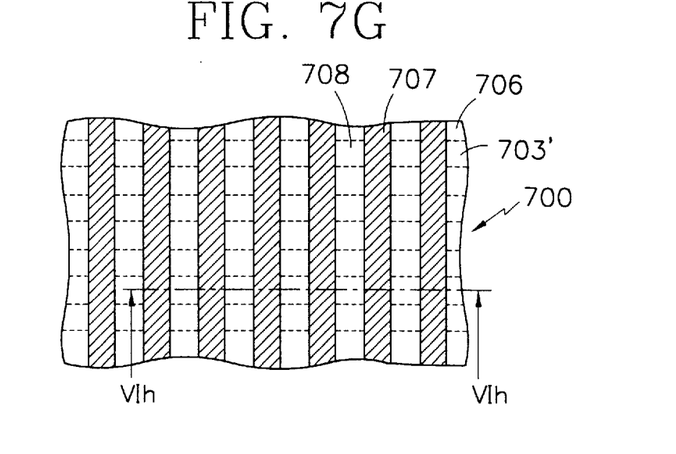

Next, the gate insulation film 706 is formed on the entire surface of the semiconductor substrate of FIG. 7E, and a conductive layer is formed on the gate insulation film 706, and the resultant structure is patterned, thereby forming a plurality of gate electrode patterns 707 extended in a direction perpendicular to the line-shaped active region 703'. A dopant is implanted into the semiconductor substrate 700 at both sides of the gate electrode pattern 707 for thereby forming a dopant layer 708, namely, a source 708 and a drain 708. At this time, the gate insulation film 706 is preferably formed by one selected from the group comprising a silicon oxide film, a nitride film and a NO (nitric oxide) film formed by the thermal oxidation method. In addition, the gate electrode pattern 707 is formed of a polysilicon or a polycide that a silicide layer is formed on the polysilicon or is formed of a metal such as a tungsten.

Figure 7H:
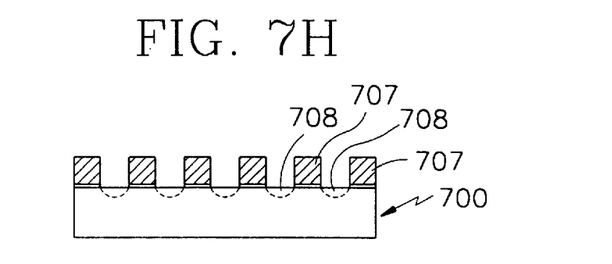

FIG. 7H is a cross-sectional view illustrating the semiconductor substrate taken along the line VIh—VIh of FIG. 7G.

Figure 7I:
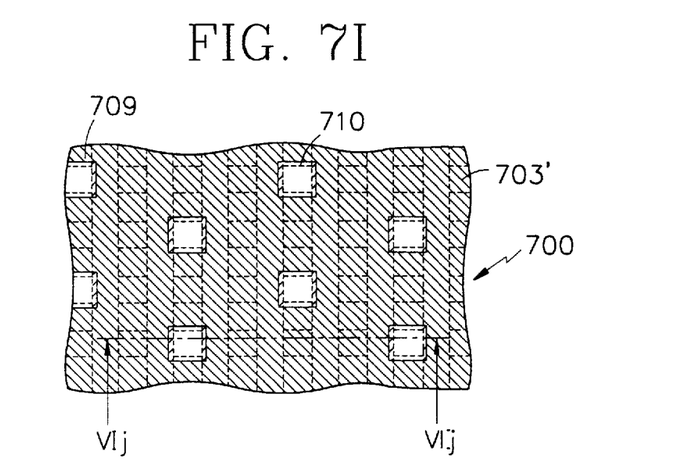

A second mask pattern 709 is formed on the upper surface of the semiconductor substrate 700, as shown in FIG. 7I. The second mask pattern 709 has an opening portion 710 only at a predetermined portion of the line-shaped active region 703'.

Figure 7J:
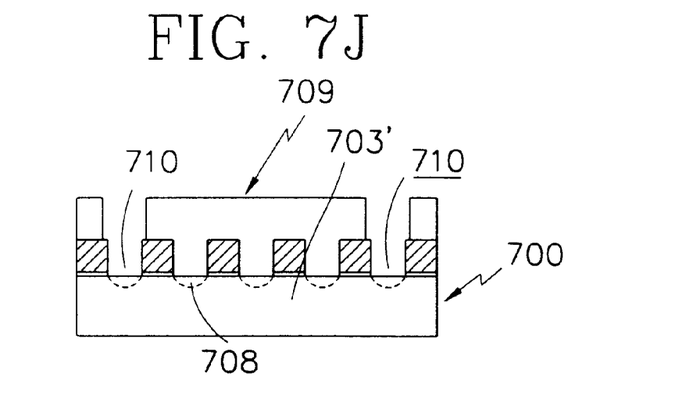

FIG. 7J is a cross-sectional view taken along the line VIj—VIj of FIG. 7I.

Figure 7K:
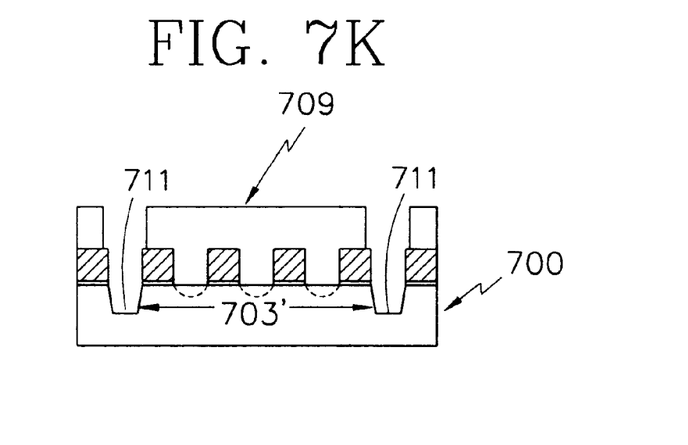

As shown in FIG. 7K, a predetermined portion of the line-shaped active region 703' is etched through the opening portion 710 for thereby forming a groove 711.

Figure 7L:
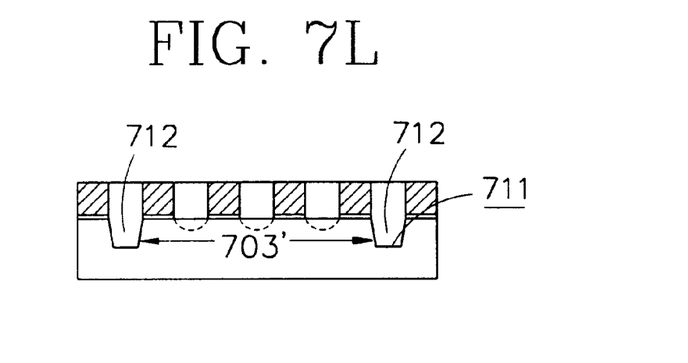

Next, the second mask pattern 709 is removed, and the third insulation 712 film is formed on the entire portion of the semiconductor substrate 700 and then the resultant structure is planerized, and the groove 711 is filled by the third insulation film 712 for thereby fabricating a semiconductor device according to the present invention. The portion filled by the third insulation film 712 is a second active region 712.

As described above, in the method for fabricating a semiconductor device isolation structure according to the present invention, it is possible to enhance the integrity of the semiconductor device and increasing a reliability of the semiconductor device fabricated using the isolation structure according to the present invention.

Although the preferred embodiment of the present invention have been disclosed for illustrative purposes, those skilled in the art will appreciate that various modifications, additions and substitutions are possible, without departing from the scope and spirit of the invention as recited in the accompanying claims.

What is claimed is:

1. A method for fabricating a semiconductor device having at least one active region of a predetermined length, the me-hod comprising:

forming a line-shaped active region on a semiconductor substrate, a length of said line-shaped active region being greater than the predetermined length;

electrically isolating at least one segment of the line-shaped active region to form an active region having the predetermined length; and forming source and drain regions in the substrate before electrically isolating at least one segment in the line-shaped region.

2. The method of claim 1, wherein forming the source and drain regions includes:

forming gate electrode patterns on the line-shaped active region; and forming the source and drain regions in portions of the substrate positioned between the gate electrode patterns.

3. The method of claim 2, wherein forming the source and drain regions in portions of the substrate includes:

doping portions of the substrate positioned between the gate electrode patterns.

4. The method of claim 2, wherein electrically isolating the line-shaped active region includes:

replacing a portion of the line-shaped active region with an insulating film at a predetermined position, where the insulating film separates the gate electrode patterns adjacent to the predetermined position.

5. A method for fabricating a semiconductor device having at least one active region of a predetermined length, the method comprising:

forming a line-shaped active region on a semiconductor substrate, a length of said line-shaped active region being greater than the predetermined length;

electrically isolating at least one segment of the line-shaped active region to form an active region having the predetermined length; and wherein said forming includes, forming a line-shaped first mask pattern on the semiconductor substrate, said line-shaped first mask pattern extending continuously in a direction parallel to a length of the line-shaped mask pattern for a distance greater than the predetermined distance;

forming a trench by etching the semiconductor substrate using the first mask pattern;

removing the first mask pattern to reveal a line-shaped active region; and filling the trench with an insulation film.

6. The method of claim 5, wherein said electrical isolating includes:

forming a second mask pattern on the semiconductor substrate, the second mask pattern having an open portion corresponding to a predetermined portion of the line-shaped active region;

forming a groove by etching the predetermined portion of the line-shaped active region through the open portion of the second mask pattern; and filling the groove with an insulation film.

7. The method of claim 6, wherein said first mask pattern and second mask pattern are formed of a photoresist.

8. The method of claim 6, further comprising:

forming an insulation film on the semiconductor substrate before forming the first mask pattern on the semiconductor substrate.

9. The method of claim 6, wherein filling the insulation film into the trench includes:

forming an insulation film on the entire structure of the semiconductor substrate having the trench; and etching-back the insulation film.

10. The method of claim 6, wherein filling the insulation film into the trench includes:

forming an insulation film on the entire structure of the semiconductor substrate having the trench; and planerizing the insulation film based on a chemical and mechanical polishing method until the upper surface of the semiconductor substrate of the line-shaped active region is exposed.

11. The method of claim 6, wherein filling the insulation film into the groove includes:

forming an insulation film on the entire structure of the semiconductor substrate having the groove; and etching-back the insulation film.

12. The method of claim 3, wherein filling the insulation film into the groove includes:

forming an insulation film on the entire structure of the semiconductor substrate having the groove; and planerizing the insulation film based on a chemical and mechanical polishing method until the upper surface of the semiconductor substrate of the line-shaped active region is exposed.

13. A method for fabricating a semiconductor device having at least one active region of a predetermined length, comprising:

forming a line-shaped first mask pattern on a semiconductor substrate, a length of said line-shaped first mask pattern being greater than the predetermined length;

forming a trench by etching the semiconductor substrate using the first mask pattern;

removing the first mask pattern to expose a line-shaped active region;

forming a first non-active region by filling an insulation film into the trench;

forming a gate insulation film on the semiconductor substrate;

forming a gate electrode pattern in a direction perpendicular to the line-shaped active region by forming a conductive layer on the gate insulation film and patterning the same;

implanting a dopant into the semiconductor substrate at both sides of the gate electrode pattern;

forming a second mask pattern having an opening portion at a predetermined portion of the line-shaped active region on the entire structure of the semiconductor substrate;

forming a groove by etching the semiconductor substrate through the opening portion; and forming a second non-active region by filling the insulation film into the groove.

14. The method of claim 13, wherein said gate insulation film is formed of one selected from the group comprising a silicon oxide film, a nitride film, and a NO (nitric oxide) film.

15. The method of claim 13, wherein said gate electrode pattern is formed of one selected from the group comprising a polysilicon layer, a polycide layer and a metal layer.

* * * * *